US012722969B2

(12) United States Patent
Ferrari et al.

(10) Patent No.: US 12,722,969 B2
(45) Date of Patent: Sep. 1, 2026

(54) PROCESS FOR MANUFACTURING A MICRO-ELECTRO-MECHANICAL DEVICE INCLUDING TWO CHAMBERS AT DIFFERENT PRESSURES AND RELATED MICRO-ELECTRO-MECHANICAL DEVICE

(71) Applicant: STMICROELECTRONICS S.r.l., Agrate Brianza (IT)

(72) Inventors: Paolo Ferrari, Gallarate (IT); Flavio Francesco Villa, Milan (IT)

(73) Assignee: STMICROELECTRONICS S.r.l., Agrate Brianza (IT)

(*) Notice: Subject to any disclaimer, the term of this patent is extended or adjusted under 35 U.S.C. 154(b) by 395 days.

(21) Appl. No.: 18/486,044

(22) Filed: Oct. 12, 2023

(65) Prior Publication Data

US 2024/0124299 A1 Apr. 18, 2024

(30) Foreign Application Priority Data

Oct. 17, 2022 (IT) ........................ 102022000021366

(51) Int. Cl.
*B81C 1/00* (2006.01)
*B81B 3/00* (2006.01)

(52) U.S. Cl.
CPC ........ *B81C 1/00269* (2013.01); *B81B 3/0021* (2013.01); *B81B 2201/0235* (2013.01); (Continued)

(58) Field of Classification Search
CPC ......... B81C 1/00269; B81C 2203/0118; B81C 2203/0145; B81B 3/0021; B81B 2201/0235; B81B 2201/0242; B81B 7/02
See application file for complete search history.

(56) References Cited

U.S. PATENT DOCUMENTS

2012/0299127 A1 11/2012 Fujii et al.
2016/0272486 A1 9/2016 Shin et al.
2016/0368763 A1* 12/2016 Gonska ..................... B81B 7/02

FOREIGN PATENT DOCUMENTS

DE 102020203573 A1 * 9/2021 ............... B81B 7/02

OTHER PUBLICATIONS

Translation of DE 102020203573 A1 (Year: 2020).*

* cited by examiner

*Primary Examiner* — William B Partridge
*Assistant Examiner* — Ilker Ozden
(74) *Attorney, Agent, or Firm* — Seed IP Law Group LLP

(57) ABSTRACT

Process for manufacturing a MEMS device, including: forming a dielectric region which coats part of a semiconductive substrate of a first semiconductive wafer; forming a region which is permeable to gases and coats the dielectric region; coupling the first semiconductive wafer to a second semiconductive wafer so as to form a first chamber, which houses a first movable mass and has a pressure equal to a first value, and a second chamber, which houses a second movable mass and has a pressure equal to the first value, the permeable region facing the second chamber; selectively removing a portion of the semiconductor substrate and an underlying portion of the dielectric region, so as to expose a part of the permeable region, so as to allow gas exchanges through the permeable region; placing the first and the second semiconductive wafers in an environment with a pressure equal to a second value, so that the pressure in the second chamber becomes equal to the second value; and subsequently forming, on the exposed part of the permeable region, a sealing region impermeable to gases.

20 Claims, 14 Drawing Sheets

(52) U.S. Cl.
CPC ................. *B81B 2201/0242* (2013.01); *B81C 2203/0118* (2013.01); *B81C 2203/0145* (2013.01)

6
11
13
12
2
4
Z
X
Y 11
20B
19
20C
18
20A
13
16
19
20B
20C
12
2
4

4
2
$S_t$
$S_b$
11
12
13
16
18
19
20A
20B
20C
25
26A
26B
26C
Z
X
Y 4
2
$S_t$
$S_b$
11
12
13
16
18
19
20A
20B
20C
25
26A
26B
26C
29
Z
X
Y

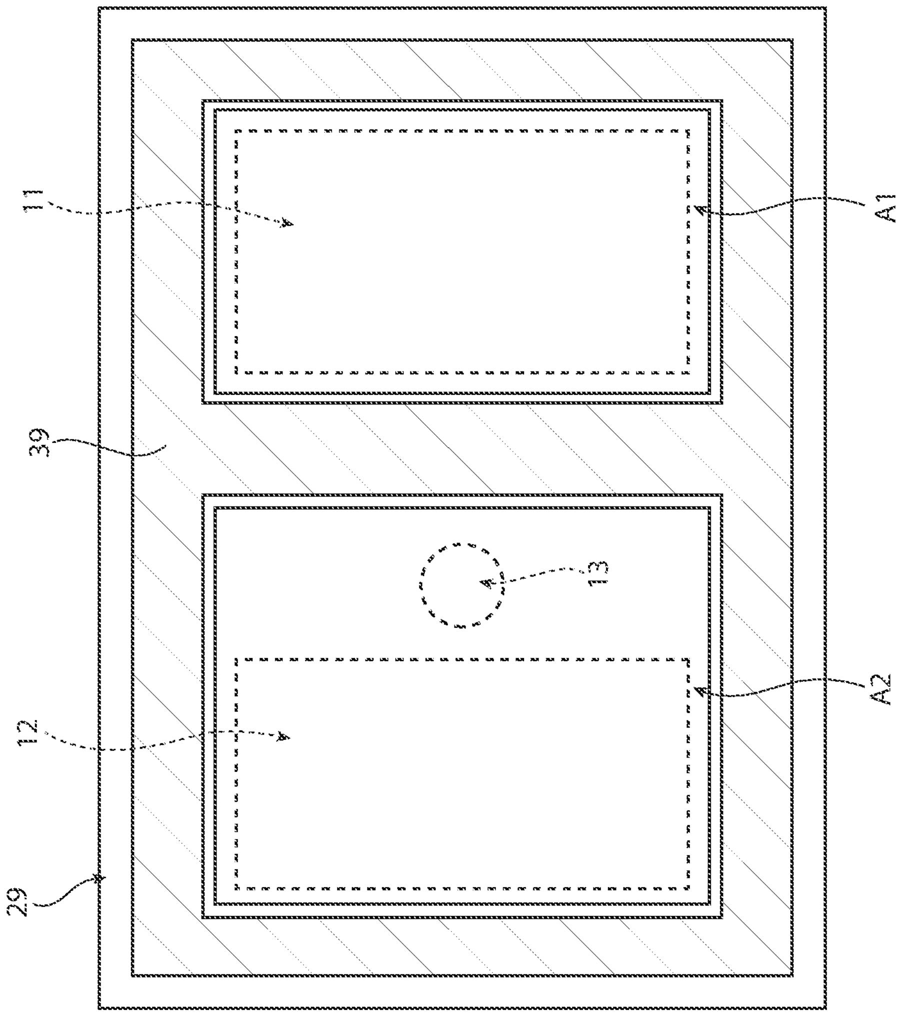
FIG. 5
11
39
12
29
13
A1
A2
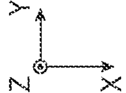
Y
Z
X 2
4
11
12
13
16
18
19
20A
20B
20C
25
26A
26B
26C
32
34
39
41
42
51
52
61
62
71
72
81
82
P1
V1
V2
$S_b$
$S_{front}$
Z
Y
X P2
39
P1
11
71
61
51
81
41
V1
V2
20A
18
16
19
20B
26B
26C
20C
13
89
26A
12
P2
72
25
52
82
62
42
2
32
4
34
Z
X
Y 39
11
P1
71
61
51
81
61
41
V1
39
V2
90
16
19
20B
26B
18
20A
26C
20C
13
89
26A
19
20B
26B
20C
26C
62
12
P2
52
72
82
25
62
42
2
39
32
4
$S_b$
$S_{front}$
34
Z
Y
X 100
4
2
91
90
89
103
93
$S_{front}$
34
32
39
39
39
11
P1
71
12
P2
72
25
16
18
19
19
20A
20B
20B
26A
26B
26B
20C
20C
26C
26C
13
V1
V2
41
42
51
52
61
61
62
62
81
82
Z
Y
X 39
11
71
61
51
81
61
41
V1
39
V2
116
126A
118
62
12
52
72
82
62
25
42
2
32
39
4
$S_b$
$S_{front}$
34
Z
Y
X 39
11
71
61
51
81
61
41
V1
39
90
V2
116
126A
116
89
118
62
12
52
72
82
62
25
42
2
39
32
4
Sb
Sfront
34
Z
Y
X 139
P1
61
51
81
71
61
41
39
V1
V2
116
126A
P1
62
52
72
82
62
42
2
25
139
32
4
$S_b$
$S_{front}$
34
Z
Y
X

PROCESS FOR MANUFACTURING A MICRO-ELECTRO-MECHANICAL DEVICE INCLUDING TWO CHAMBERS AT DIFFERENT PRESSURES AND RELATED MICRO-ELECTRO-MECHANICAL DEVICE

BACKGROUND

Technical Field

The present disclosure relates to a process for manufacturing a micro-electro-mechanical (MEMS) device including two chambers at different pressures, as well as to the related MEMS device.

Description of the Related Art

As is known, MEMS devices are nowadays available which function as accelerometers; furthermore, MEMS devices are known which function as angular speed sensors, i.e., as gyroscopes. Both MEMS accelerometers and MEMS gyroscopes include respective movable masses, which are suspended within respective cavities, also known as chambers.

In particular, it is known that, in the case of MEMS accelerometers, the pressure within the chamber is relatively high (for example, of the order of 100 mbar), in order to dampen the movement of the movable mass and reduce the related vibrations. Conversely, in the case of MEMS gyroscopes, the pressure within the chamber is reduced (for example, lower than 1 mbar), so that the movable mass may be oscillated (typically, with a frequency close to the resonance frequency) by using a reduced voltage; in this case, the reduced pressure within the chamber causes the damping to which the movable mass is subject to be reduced.

Given the different pressure-related requirements, the integration of a MEMS accelerometer and a MEMS gyroscope in a single device, and therefore from a same semiconductive wafer is difficult. For example, US20160368763 A1 describes a solution to this problem, which however provides for using a cap wafer and a substrate, so as to form two cavities laterally offset and initially set to a first pressure, and subsequently for selectively removing a portion of the cap wafer, so as to create an opening which communicates with one of the two cavities (which houses the movable mass of the MEMS gyroscope), which is thus set to a second pressure, lower than the first pressure; the other cavity therefore remains at the first pressure and houses the movable mass of the MEMS accelerometer; the opening is subsequently sealed by using a laser beam, which melts portions of semiconductor material surrounding the opening, which solidify again, forming a closing region of the opening. This solution therefore requires the use of a laser source within the environment wherein the manufacturing process occurs, therefore it is technologically complex.

BRIEF SUMMARY

The present disclosure is directed to at least one solution which at least partially overcomes the drawbacks of the prior art.

The present disclosure is directed to at least one embodiment of a process for manufacturing at least one embodiment a MEMS device of the present disclosure.

At least one embodiment of a device of the present disclosure may be summarized as including: a cap including: a semiconductive substrate; a dielectric region that coats part of the semiconductive substrate; and a permeable region, which is permeable to gases, that coats the dielectric region, and the dielectric region is interposed between the semiconductive substrate and the permeable region, a main body coupled to the cap, the main body including a first cavity, a second cavity, a first movable mass, and a second movable mass, the first movable mass is suspended over the first cavity and the second movable mass is suspended over the second cavities; a first chamber is delimited by a corresponding portion of the cap, the first chamber includes the first cavity and houses the first movable mass, the first chamber being hermetically closed, a first pressure within the first chamber being equal to a first value; and a second chamber is delimited by a corresponding portion of the cap, the second chamber includes the second cavity and houses the second movable mass, the second chamber being hermetically closed, a second pressure within the second chamber being equal to a second value, the permeable region overlaps the second chamber, an opening that extends through the semiconductive substrate and the dielectric region to the permeable region; and a sealing region, which is impermeable to gases, that extends into the opening to the permeable region and hermetically closes the second chamber.

BRIEF DESCRIPTION OF THE SEVERAL VIEWS OF THE DRAWINGS

For a better understanding of the present disclosure, embodiments thereof are now described, purely by way of non-limiting example, with reference to the attached drawings, wherein:

FIG. 5 schematically shows a top view with portions removed of a portion of the MEMS device during a step of the manufacturing process;

DETAILED DESCRIPTION

Figures 1, 2:
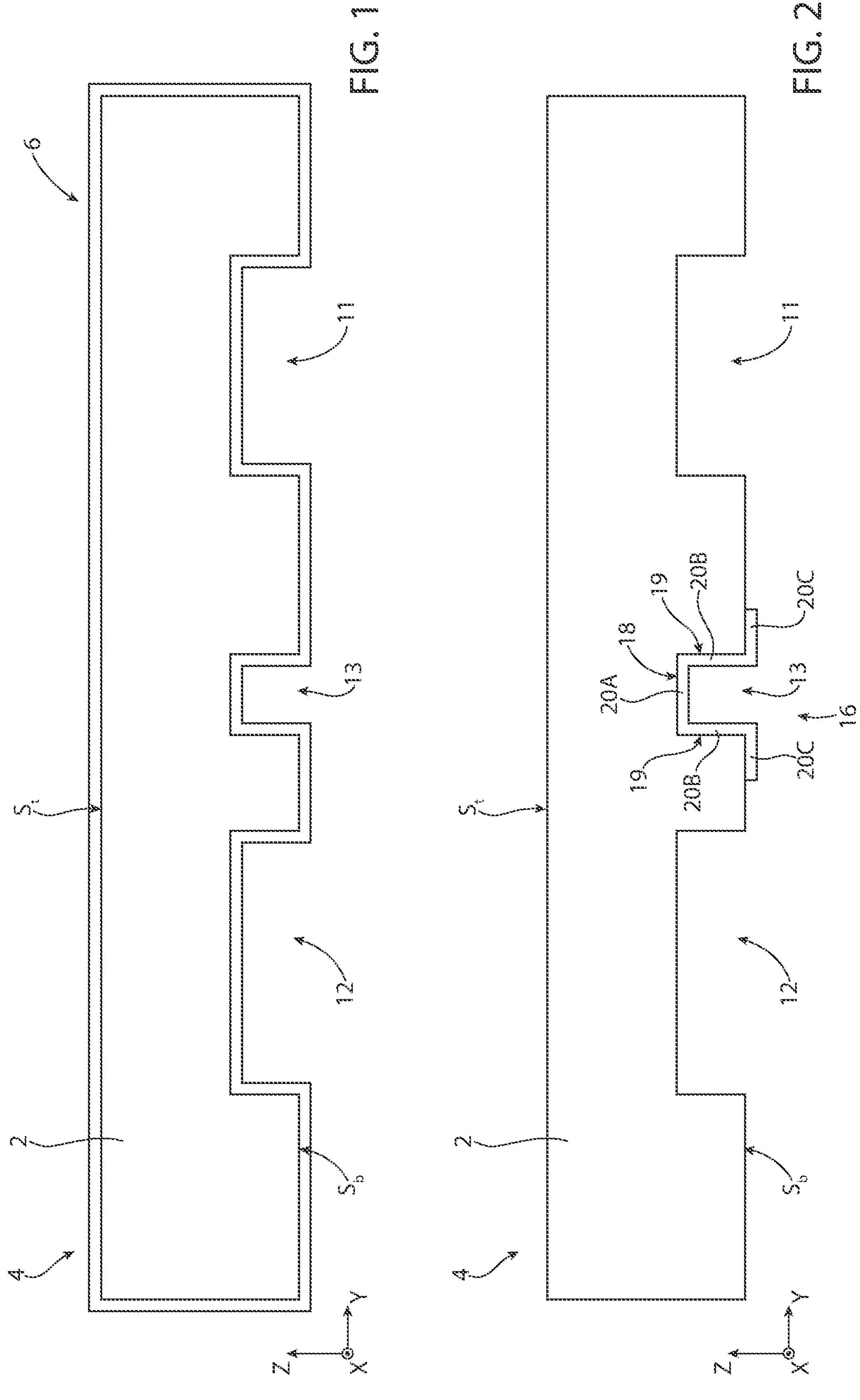
FIGS. 1-4 and 6-11 schematically show cross-sections of the present MEMS device during subsequent steps of the manufacturing process.

The present manufacturing process provides for carrying out a thermal oxidation process of a semiconductor substrate 2 of a first wafer 4 of semiconductor material, so as to coat the semiconductor substrate 2 with a dielectric layer 6 of thermal oxide, as shown in FIG. 1.

In greater detail, the semiconductor substrate 2 may be formed, for example, by silicon; in this case, the dielectric layer 6 is formed by silicon oxide. Furthermore, the semiconductor substrate 2 is delimited upwardly and downwardly by a top surface $S_t$ and, respectively, a bottom surface Se, which are parallel to an XY plane of an orthogonal reference system XYZ.

In addition, the semiconductor substrate 2 forms a first and a second main cap cavity 11, 12 and a secondary cap cavity 13. The first main cap cavity 11 may be referred to as a first cavity, the second main cap cavity 12 may be referred to as a second cavity, and the secondary cap cavity 13 may be referred to as a third cavity or a third cap cavity. In at least some embodiments, the secondary cap cavity 13 is smaller than the first main cap cavity 11 and the second main cap cavity 12.

The first and the second main cap cavities 11, 12 are open downwardly, face the bottom surface Se of the semiconductor substrate 2 and are laterally offset from each other (based on the orientation as shown in FIGS. 1 and 2). In other words, the first and the second main cap cavities 11, 12 extend from the bottom surface Se of the semiconductor substrate 2, towards the top surface $S_t$; furthermore, the first and the second main cap cavities 11, 12 are closed upwardly. Without any loss of generality, as a first approximation the first and the second main cap cavities 11, 12 have for example the shape of parallelepipeds; the shape of the first and the second main cap cavities 11, 12 is, in any case, irrelevant for the purposes of the present manufacturing process.

The secondary cap cavity 13 is open downwardly and faces the bottom surface Se of the semiconductor substrate 2. Furthermore, the secondary cap cavity 13 is laterally offset with respect to the first and the second main cap cavities 11, 12, so as to be interposed between the first and the second main cap cavities 11, 12. Again without any loss of generality and purely by way of example, the secondary cap cavity 13 may have the shape of a cylinder.

Purely by way of example, the secondary cap cavity 13 and the first and the second main cap cavities 11, 12 have a same depth, measured along the Z axis.

The dielectric layer 6 entirely coats the semiconductor substrate 2. In particular, the dielectric layer 6 also coats the portions of the semiconductor substrate 2 which laterally and upwardly delimit the secondary cap cavity 13 and the first and the second main cap cavities 11, 12.

In greater detail, in the example shown in FIG. 1, the dielectric layer 6 coats the portions of the semiconductor substrate 2 that delimit the secondary cap cavity 13 and the first and the second main cap cavities 11, 12 in a conformal manner, therefore without completely filling the secondary cap cavity 13 and the first and the second main cap cavities 11, 12.

Subsequently, as shown in FIG. 2, an etch (for example, of the dry-type) is performed, so as to selectively remove portions of the dielectric layer 6. In particular, following the etch, the residual portion of the dielectric layer 6 forms a region 16, hereinafter referred to as the dielectric region 16.

In particular, indicating respectively by 18 and 19 the top wall and the side wall of the secondary cap cavity 13, the dielectric region 16 includes: an internal portion 20A, which coats the top wall 18 of the secondary cap cavity 13; a side portion 20B, which coats the side wall 19 of the secondary cap cavity 13; and an external portion 20C, which extends below the bottom surface Se, so as to coat downwardly the part of the semiconductor substrate 2 which forms the side wall 19 of the secondary cap cavity 13.

Figures 3, 4:
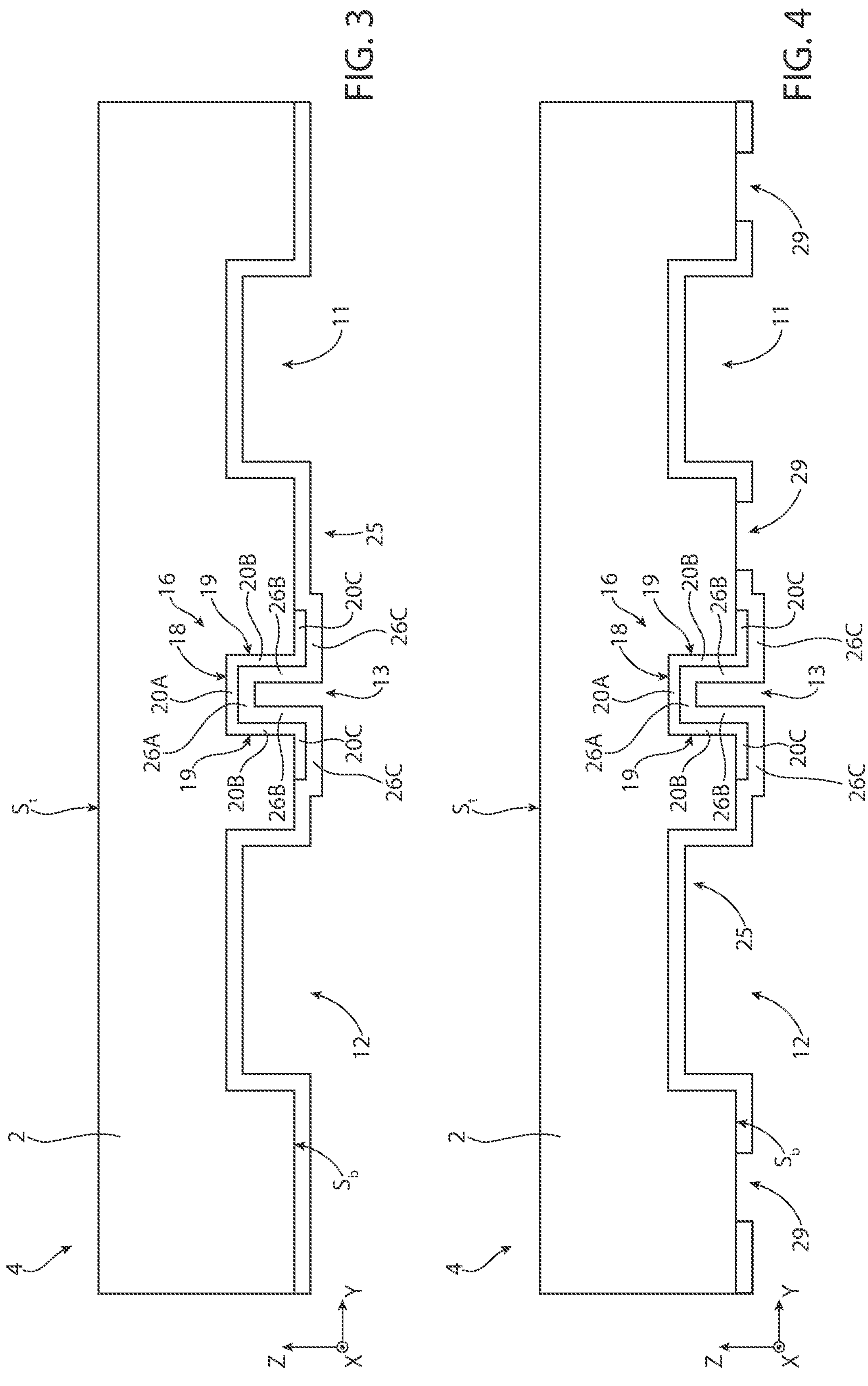

Then, as shown in FIG. 3, a permeable polysilicon deposition is carried out, so as to form a permeable layer 25 which coats the bottom surface Se, the first and the second main cap cavities 11, 12 and the dielectric region 16.

In greater detail, the permeable layer 25 has a thickness for example comprised between 60 nm and 140 nm and is formed for example by low pressure chemical vapor deposition (LPCVD), using silane ($SiH_4$) as a precursor, with pressure comprised, for example between 100 mTorr and 1000 mTorr and with temperature for example comprised between 580° C. and 640° C. In this manner, the permeable layer 25 has a porous structure, permeable to gases.

In greater detail, the permeable layer 25 coats the portions of the semiconductor substrate 2 that delimit the first and the second main cap cavities 11, 12 in a conformal manner, therefore without completely filling the first and the second main cap cavities 11, 12. Furthermore, the permeable layer 25 coats the dielectric region 16 in a conformal manner. Consequently, in addition to coating the external portion 20C of the dielectric region 16, the permeable layer 25 extends within the secondary cap cavity 13 without completely filling it.

In greater detail, the permeable layer 25 comprises: a respective internal portion 26A, which coats the internal portion 20A of the dielectric region 16; a respective side portion 26B, which coats the side portion 20B of the dielectric region 16; and a respective external portion 26C, which coats the external portion 20C of the dielectric region 16.

In practice, the internal portion 20A of the dielectric region 16 is interposed between the semiconductor substrate 2 and the internal portion 26A of the permeable layer 25.

Then, as shown in FIG. 4, an etch (for example of the dry-type) is performed, so as to selectively remove portions of the permeable layer 25 and form a window 29 which traverses the permeable layer 25 and faces overlying exposed portions of the bottom surface Se of the semiconductor substrate 2.

Without any loss of generality, the window 29 is trench-shaped; furthermore, as shown in FIG. 5, in top view the window 29 is approximately '8'-shaped, so as to delimit, in top view, a first and a second area A1, A2. Furthermore, in top view, the first main cap cavity 11 extends inside the first area A1, while the second main cap cavity 12 and the secondary cap cavity 13 extend into the second area A2. In this regard, in FIG. 5, the shapes of the first and the second main cap cavities 11, 12 and of the secondary cap cavity 13 are qualitatively indicated, in dashed lines.

Figure 6:
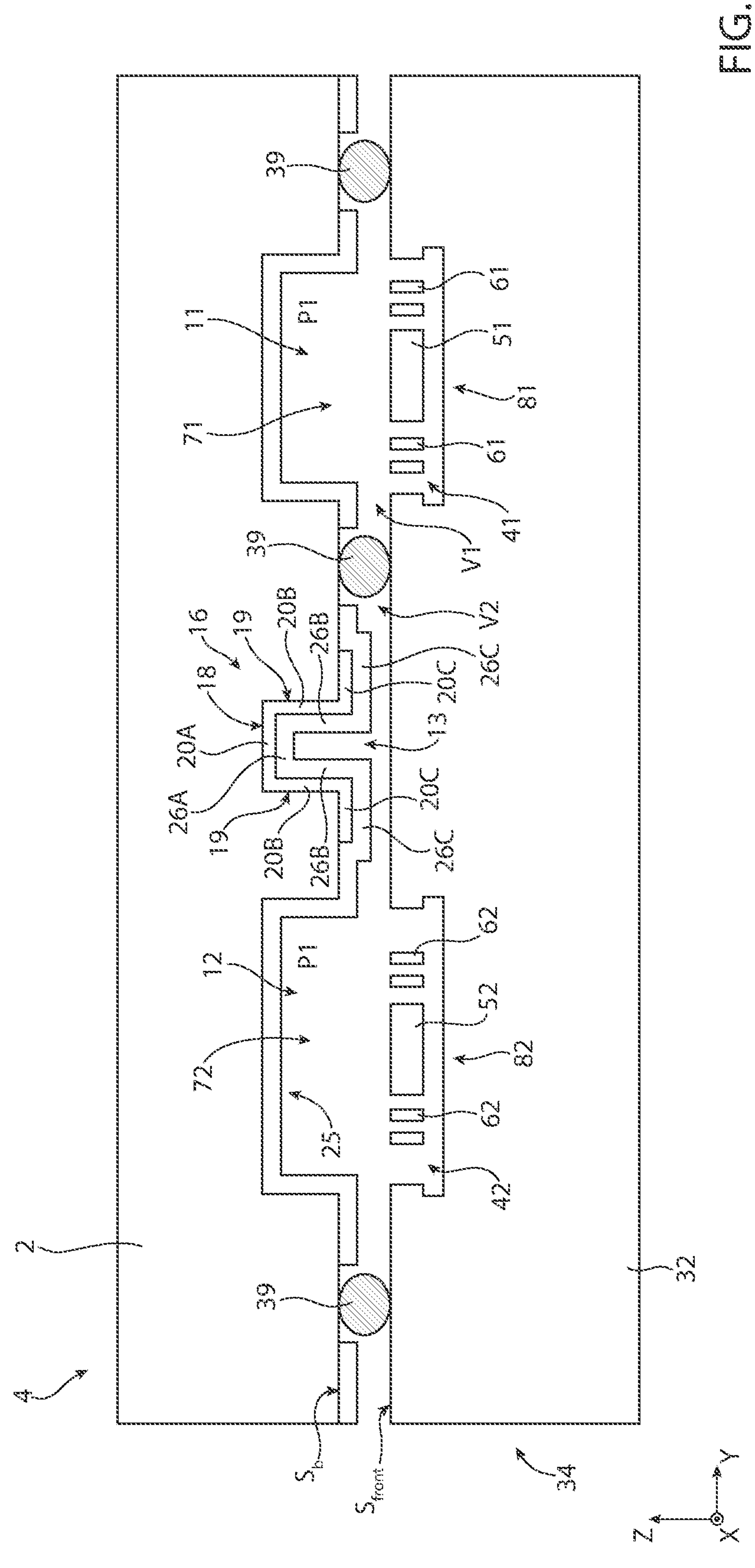

Subsequently, as shown in FIG. 6, the first wafer 4 is fixed to a second wafer 34 of semiconductive material, which comprises a main body 32 formed at least in part by semiconductor material (for example, silicon) and delimited by a front surface $S_{front}$. As explained in greater detail below, in the second wafer 34*a* first and a second cavity 41, 42, are present which extend into the main body 32 from the front surface $S_{front}$ and are laterally offset; hereinafter the first and the second cavities 41, 42 are referred to as the first and the second device cavities 41, 42.

A first and a second movable mass 51, 52 are suspended respectively on the first and the second device cavities 41, 42, respectively owing to the presence of a first deformable structure 61, mechanically interposed between the first movable mass 51 and the main body 32, and a second deformable structure 62, mechanically interposed between the second movable mass 52 and the main body 32. Each of the first and the second deformable structures 61, 62 comprises one or more respective springs, which are deformable so as to respectively allow the first and the second movable masses 51, 52 to translate (for example) parallel to the X axis and/or the Y axis, in a per se known manner.

Without any loss of generality, the first and the second wafers 4, 34 are fixed by a so-called glass-frit bonding, and in particular by an intermediate region 39 of glassy material.

In detail, as visible in FIG. 5, the intermediate region 39 is '8'-shaped, which extends, in top view, into the window 29. In greater detail, a top portion of the intermediate region 39 extends within the window 29, so as to contact the exposed portions of the bottom surface Se of the semiconductor substrate 2, while a bottom portion of the intermediate region 29 contacts underlying portions of the main body 32 of the second wafer 34, these latter portions being laterally offset with respect to the first and the second device cavities 41, 42. In other words, the intermediate region 39 (i.e., glass-frit region) extends continuously around the first and second areas A1, A2 and between the first and second areas A1, A2 (see FIG. 5 of the present disclosure).

In still greater detail, the intermediate region 39 laterally delimits a first and a second volume V1, V2. Following the bonding of the first and the second wafers 4, 34, the first main cap cavity 11 faces the underlying first device cavity 41, wherewith it forms, together with the first volume V1, a first chamber 71 of the closed type.

The second main cap cavity 12 faces the underlying second device cavity 42, which, without any loss of generality, is laterally offset with respect to the secondary cap cavity 13. Furthermore, the second main cap cavity 12 and the secondary cap cavity 13 form, together with the second volume V2 and the second device cavity 42, a second chamber 72 of the closed type.

The first and the second chambers 71, 72 are hermetically closed and are at a same first pressure P1. Furthermore, the first movable mass 51 and the first deformable structure 61 are arranged within the first chamber 71; the second movable mass 52 and the second deformable structure 62 are arranged inside the second chamber 72. Furthermore, the internal portion 26A, the side portion 26B and the external portion 26C of the permeable layer 25 face the second chamber 72.

In a per se known manner, the first movable mass 51 and the second movable mass 51 respectively form a MEMS accelerometer 81 and a MEMS gyroscope 82, integrated to each other.

Although not shown, the MEMS accelerometer 81 comprises, in a per se known manner, a detection structure (for example, of the capacitive type) for generating a signal indicative of the position of the first movable mass 51, which translates with respect to a respective rest position in the presence of accelerations. The MEMS gyroscope 82 comprises a respective actuation structure (not shown), for example of the piezoelectric type, which allows the second mobile mass 52 to oscillate around a respective rest position, as well as a respective detection structure (not shown) for generating a signal indicative of an angular speed whereto the MEMS gyroscope 1 is subject.

Figure 7:
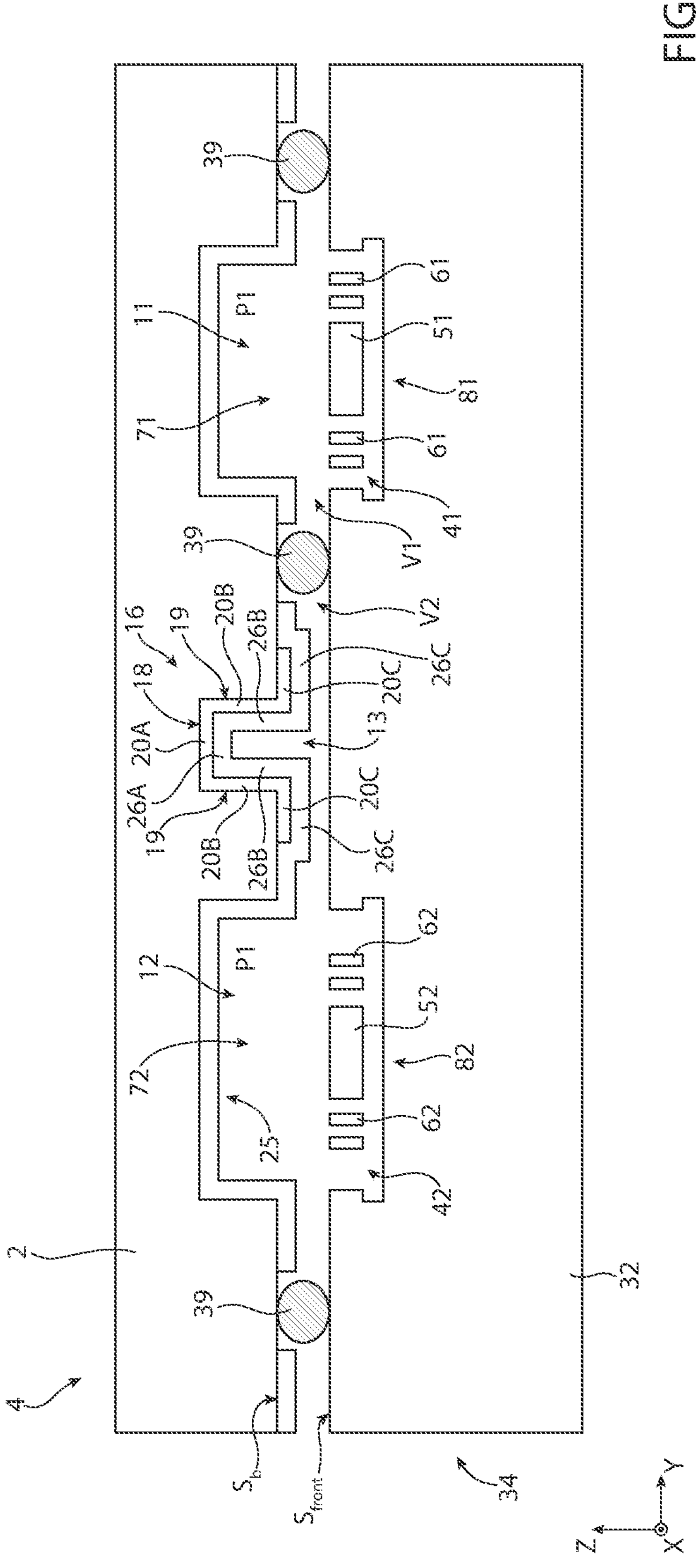

Then, a reduction of the thickness of the semiconductor substrate 2 of the first wafer 4 is optionally performed, as shown in FIG. 7.

Figure 8:

Subsequently, a dry etch is performed, in order to selectively remove a portion of semiconductor substrate 2 which overlies the internal portion 20A of the dielectric region 16, so as to expose a part of the internal portion 20A of the dielectric region 16, as shown in FIG. 8. In practice, an opening 89 is formed, which traverses the semiconductor substrate 2 and is closed downwardly by the internal portion 20A of the dielectric region 16.

Figure 9:
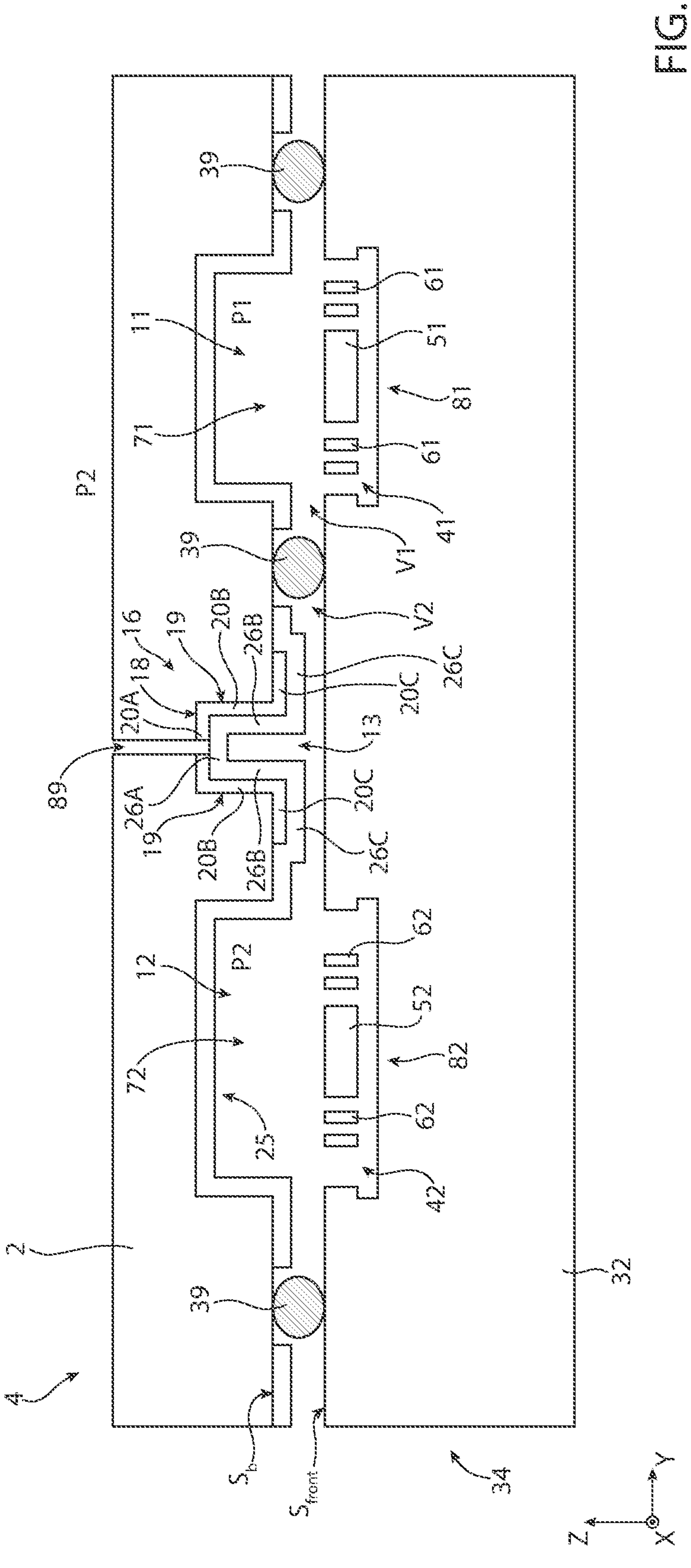

Then, as shown in FIG. 9, a dry etch is performed, so as to selectively remove the previously exposed part of the internal portion 20A of the dielectric region 16, so that the opening 89 extends up to the internal portion 26A of the permeable layer 25. In this manner, a part of the internal portion 26A of the permeable layer 25 is exposed, in the opposite direction with respect to the second chamber 72; consequently, the second chamber 72, previously hermetically closed, is temporarily placed in gaseous communication with the outside world; the first chamber 71, on the other hand, remains hermetically closed, impermeable to gas exchanges with the outside world.

In greater detail, the aforementioned dry etch of the internal portion 20A of the dielectric region 16, as possibly also the previous dry etch of the semiconductor substrate 2, occurs in an environment set to a second pressure P2, lower than the first pressure P1. In this manner, also within the second chamber 72 the pressure becomes equal to the second pressure P2, since the exceeding gas flows through the exposed part of the internal portion 26A of the permeable layer 25. The pressure inside the first chamber 71, on the other hand, remains equal to the first pressure P1. However, variants are possible wherein the group formed by the first and the second wafers 4, 34 is set in an environment to the second pressure P2 only after part of the internal portion 26A of the permeable layer 25 has been exposed.

Figure 10:
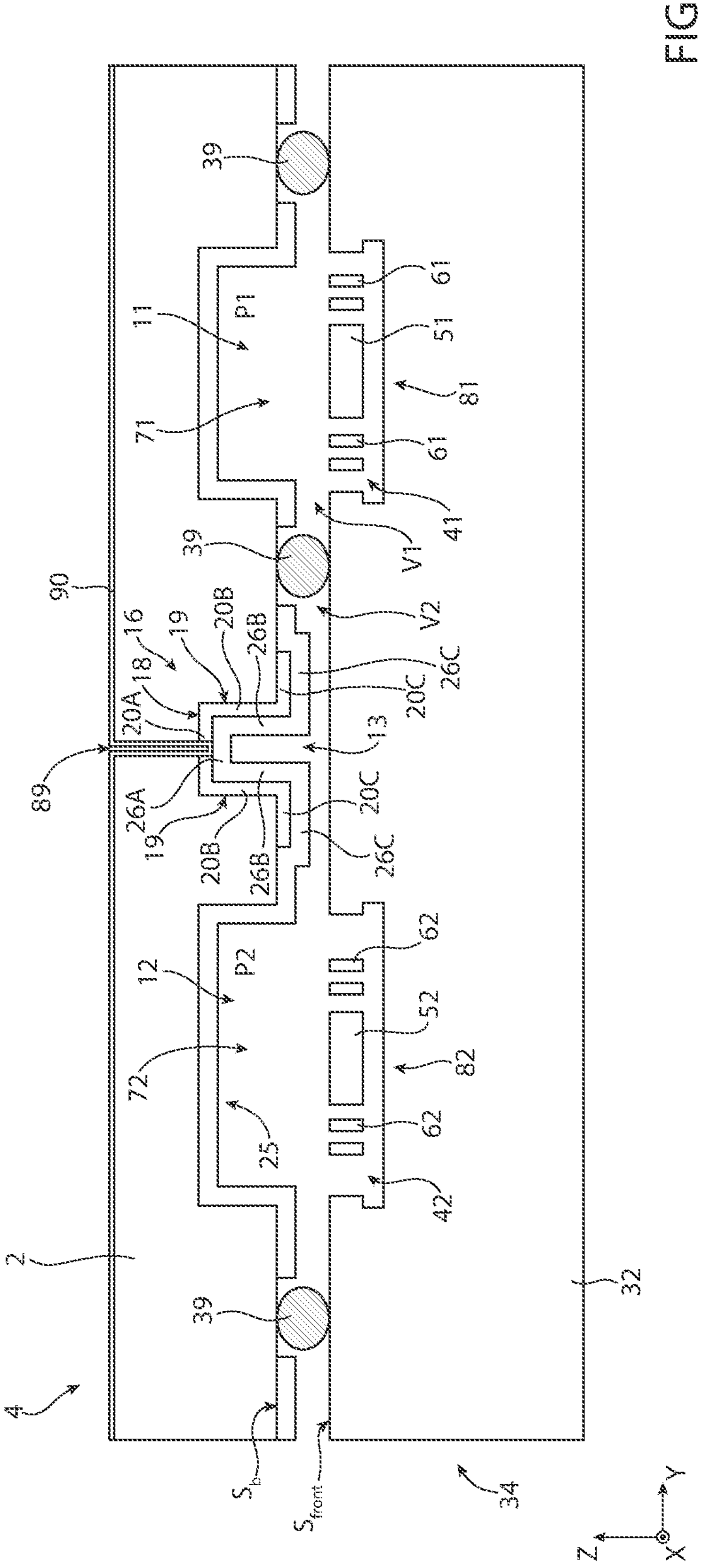

Subsequently, as shown in FIG. 10, a sealing layer 90, which also extends within the opening 89, is formed above the semiconductor substrate 2 of the first wafer 4.

In detail, the sealing layer 90 is formed by polysilicon. In particular, and by way of example, the sealing layer 90 may be formed by amorphous polysilicon, which may be formed by a plasma-enhanced chemical vapor deposition (PECVD) process; in this case, the reaction $SiH_4+Ar \rightarrow aSi+2H_2+Ar$ (wherein aSi indicates precisely amorphous polysilicon) occurs, which takes place at a fairly low temperature (for example, 350° C.) and with reduced pressure (for example, 1 mbar). In this manner, the glassy material of the intermediate region 39 is not damaged.

In greater detail, in the example shown in FIG. 10, the sealing layer 90 does not completely fill the opening 89, which therefore remains open upwardly. However, variants are possible wherein the opening 89 is completely filled by the sealing layer 90.

The sealing layer 90 coats the previously exposed part of the internal portion 26A of the permeable layer 25; the internal portion 26A of the permeable layer 25 is thus interposed between the second chamber 72 and the sealing layer 90. Furthermore, the sealing layer 90 is impermeable to gases, therefore its presence allows hermetically closing again the second chamber 72, whose pressure therefore remains fixed at the second pressure P2.

Figure 11:
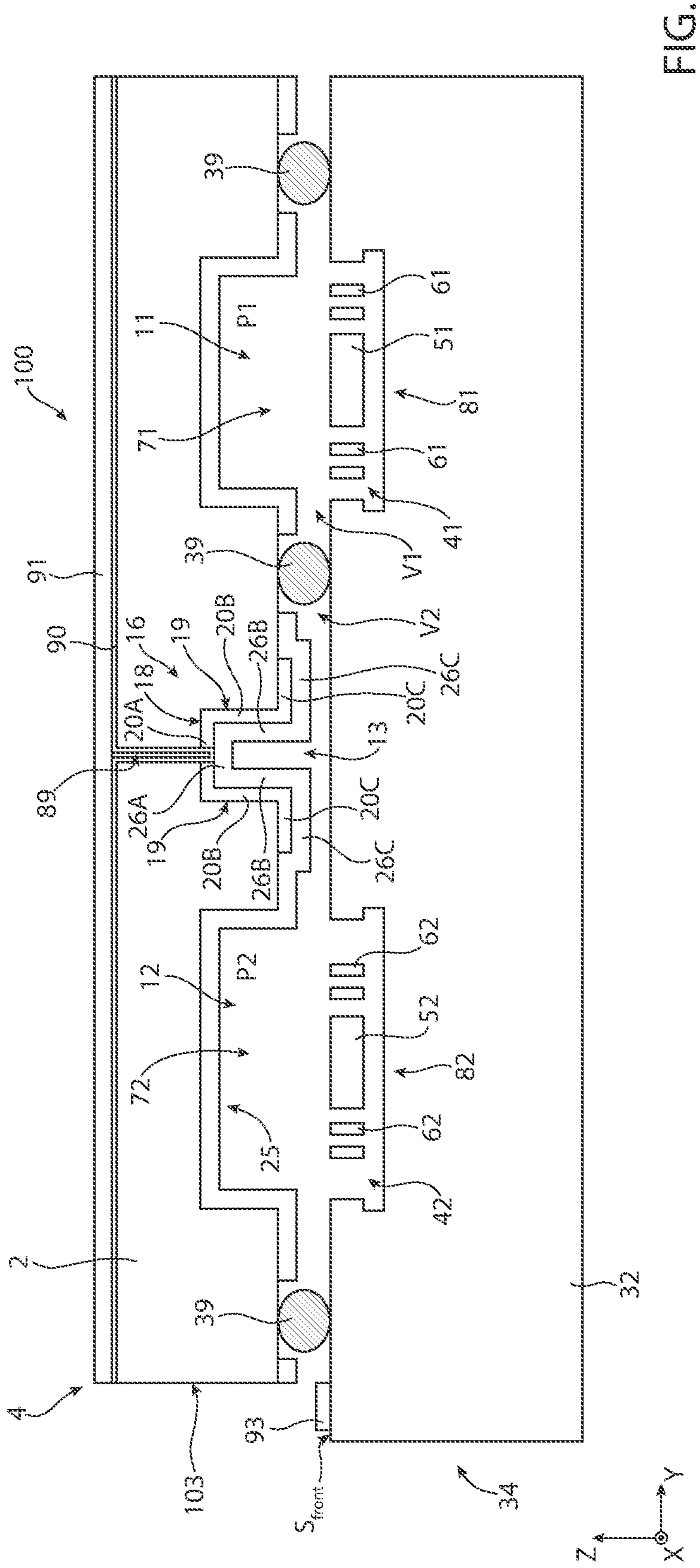

Subsequently, the manufacturing process may continue in a per se known manner. For example, as shown in FIG. 11, a temporary mask 91 of resist may be formed on the semiconductor substrate 2 of the first wafer 4 and an etch may be performed, so as to selectively remove portions of the semiconductor substrate 2 laterally offset with respect to the temporary mask 91, so as to expose portions of the main body 32 of the second wafer 34, whereon conductive pads (one shown, indicated by 93) are formed; in practice, the sealing layer 90 forms, together with the residual portions of the semiconductor substrate 2, of the dielectric region 16 and of the permeable layer 25, a cap 103 of the MEMS device 100. The conductive pads 93 allow the signals generated by the detection structures of the MEMS accelerometer 81 and of the MEMS gyroscope 82, which form a MEMS device 100, to be provided to the outside world. Then, although not shown, the temporary mask 91 is removed and the manufacturing process continues in a per se known manner.

The advantages that the present solution affords are clear from the foregoing description.

In particular, the present solution allows a MEMS device including two chambers hermetically closed and set to different pressures to be manufactured with a low-cost process, which may be implemented with standard machinery. Furthermore, the manufacturing process allows repeatable results to be obtained and ensures a good control of the pressure values that are imposed in the chambers.

Furthermore, the MEMS device 100 is characterized by a high stability of the pressure values set in the two chambers, without requiring the presence of getter regions.

Finally, it is clear that modifications and variations may be made to the manufacturing process and to the MEMS device described and illustrated herein without thereby departing from the scope of the present disclosure, as defined in the attached claims.

For example, the first and the second wafers 4, 34 may be fixed to each other in a different manner, such as for example by metal bonding. In this case, the sealing layer 90 may be formed by a different process than what has been described, such as for example a deposition process at a higher temperature than what has been described (for example, even higher than 1000° C.).

In lieu of the window 29, two separate windows, being trench-shaped, may be present in which case the first and the second volumes V1, V2 are laterally delimited by two separate intermediate regions, rather than by the intermediate region 39.

The window 29 may be absent, in which case the intermediate region 39 may contact the permeable layer 25 upwardly, rather than the semiconductive substrate 2 of the first wafer 4.

Figure 12:
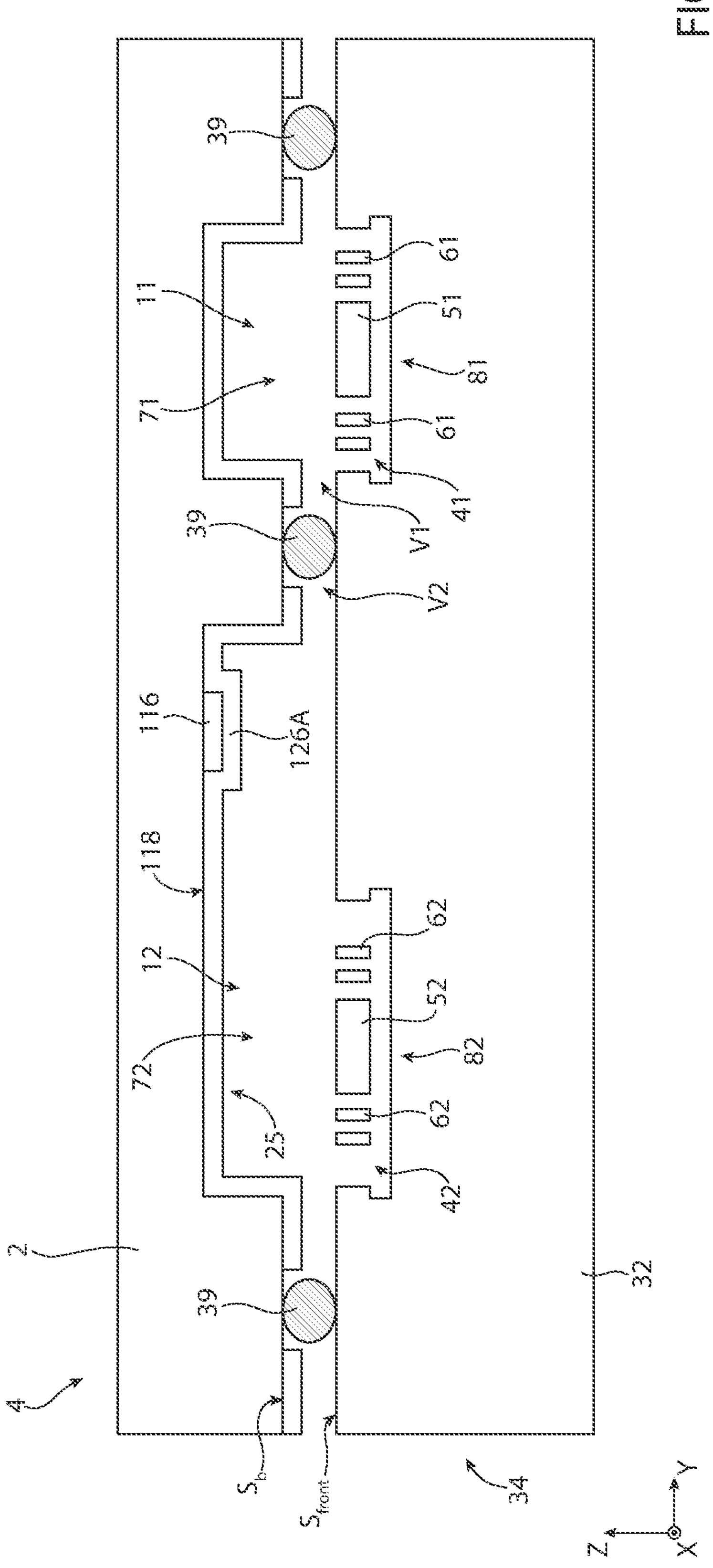
FIGS. 12-15 schematically show cross-sections of the present MEMS device during subsequent steps of a variant of the manufacturing process.

In addition, as shown for example in FIG. 12, which by way of example refers to the same step of the manufacturing process shown in FIG. 7, the secondary cap cavity 13 may be absent. In this case, the dielectric region (indicated here by 116) coats a portion of the top wall (indicated by 118) of the second main cap cavity 12 and has a planar shape; furthermore, a portion 126A of the permeable layer 25 coats the dielectric region 116 downwardly and laterally.

Figure 13:
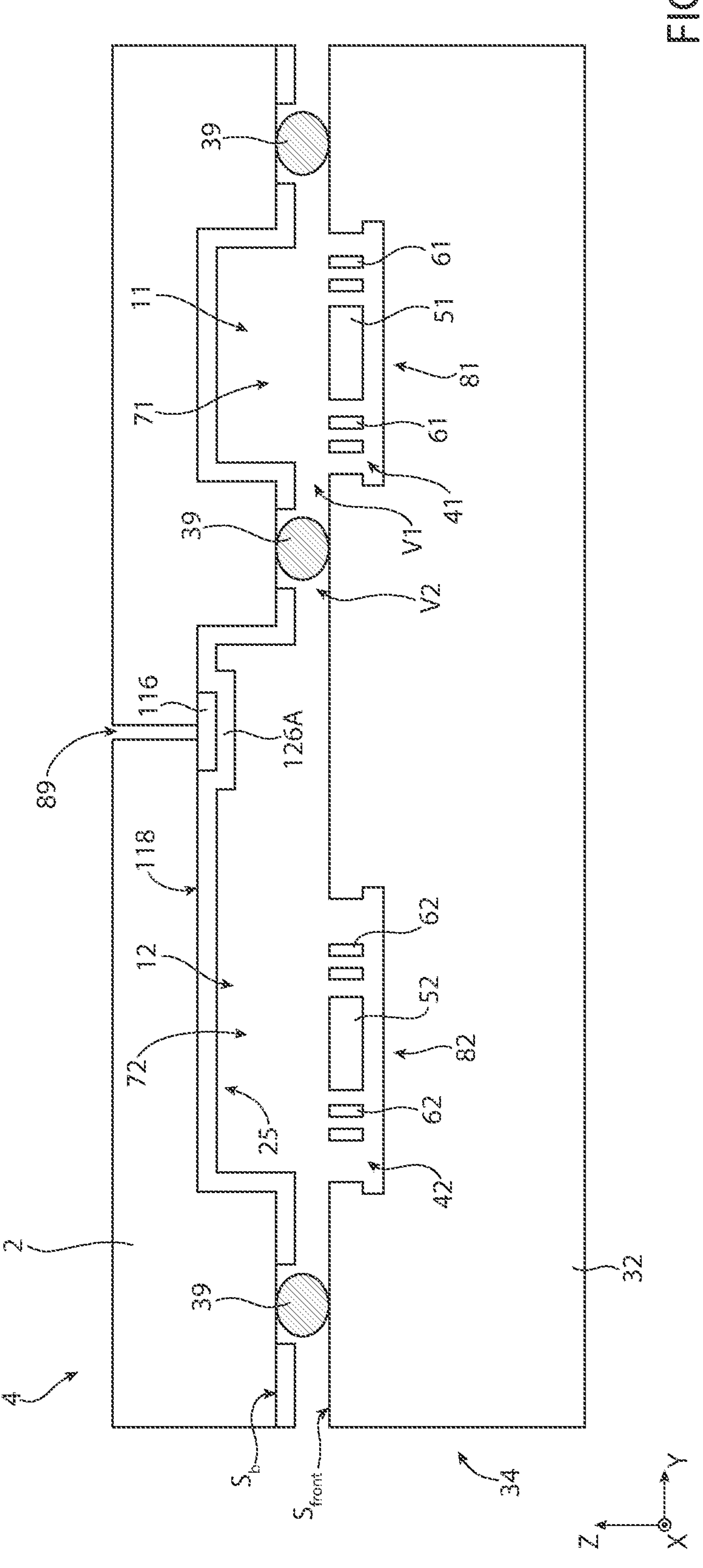
Figure 14:
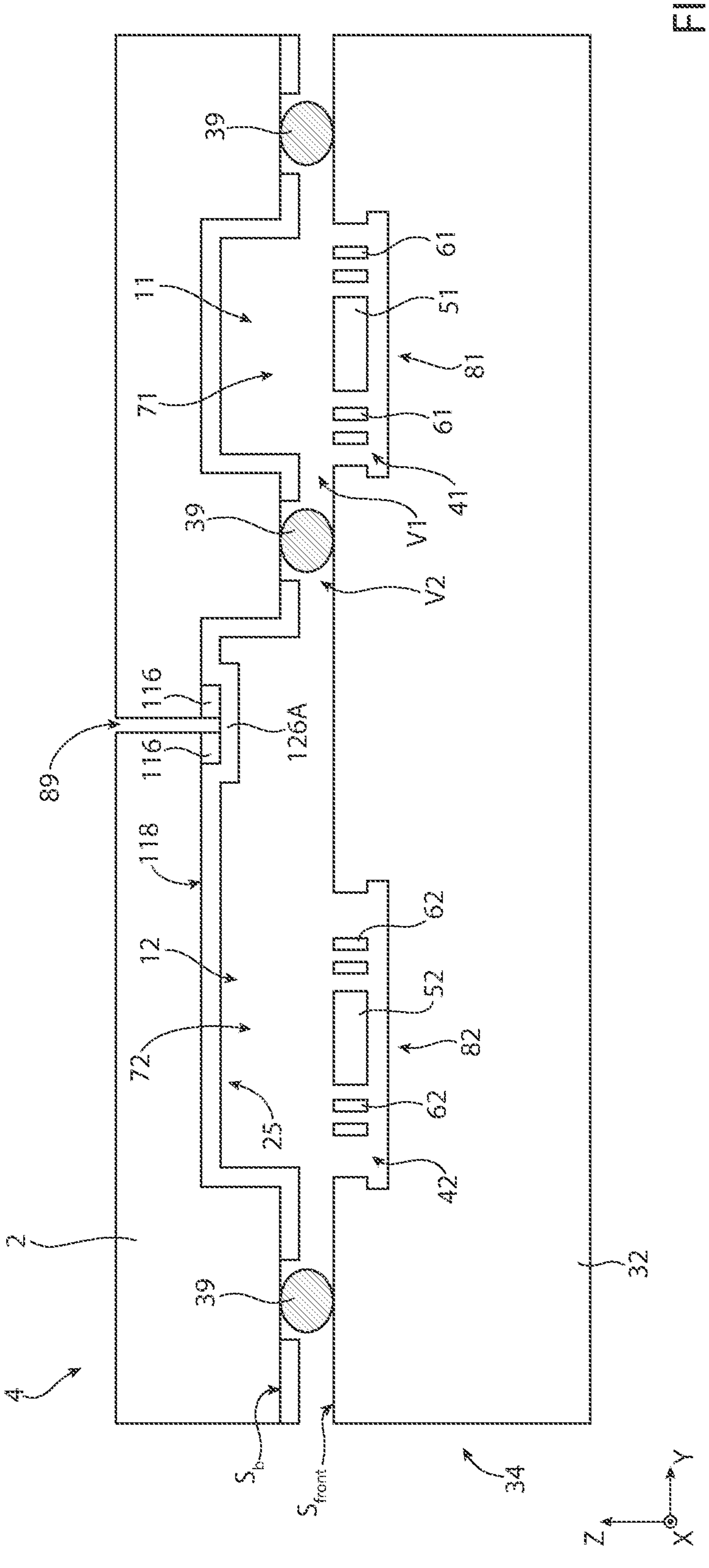
Figure 15:
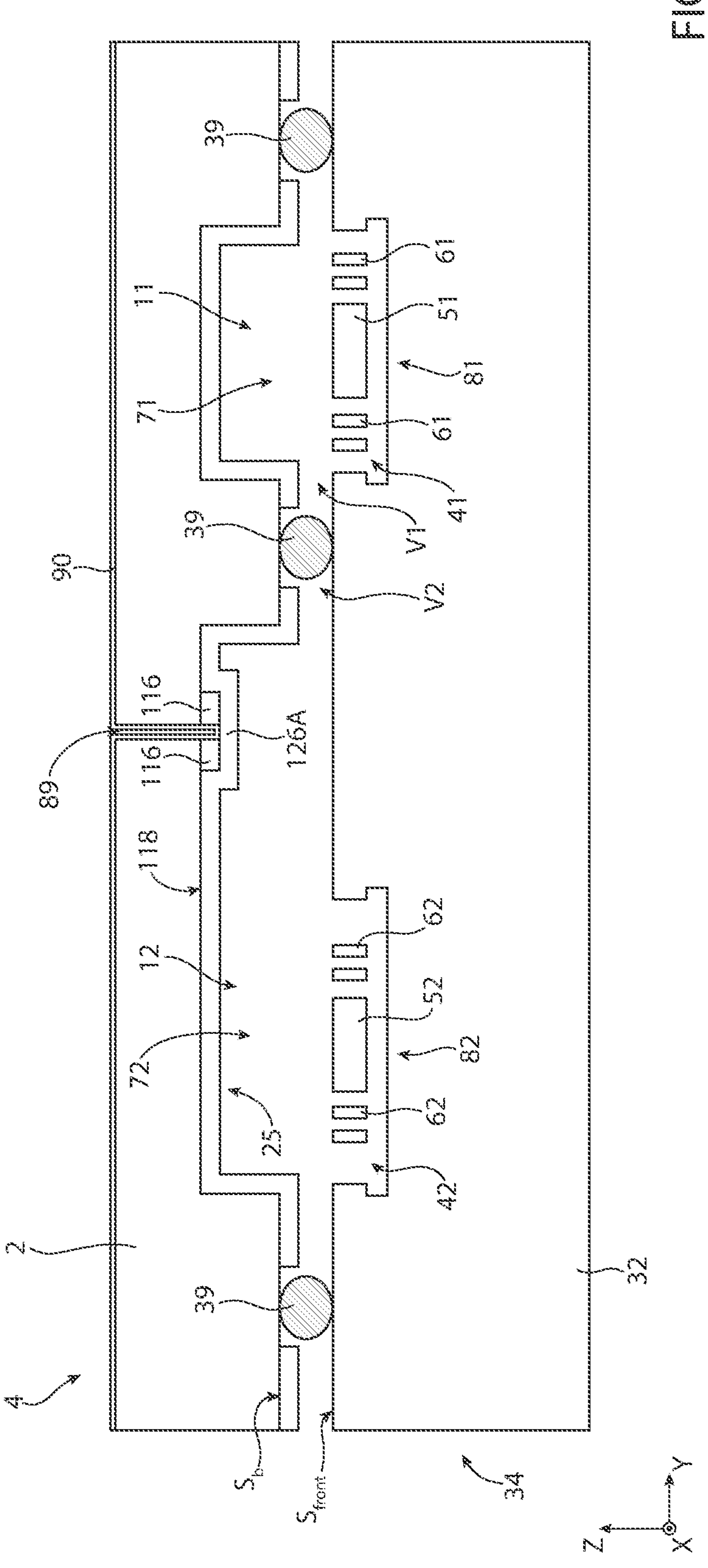

Also in the case shown in FIG. 12, the dielectric region 116 is interposed between the semiconductive substrate 2 and the portion 126A of the permeable layer 25, which faces the second chamber 72. Furthermore, the manufacturing process may continue in the same manner as described previously, in which case a portion of semiconductor substrate 2 overlying the dielectric region 116 is selectively removed, so as to expose part of the dielectric region 116, as shown in FIG. 13, wherein the opening is still indicated by 89. Subsequently, a dry etch is performed, so as to selectively remove the previously exposed part of the dielectric region 116, so that the opening 89 extends up to the portion 126A of the permeable layer 25, exposing part of the portion 126A of the permeable layer 25, as shown in FIG. 14; in this manner, gas exchanges are allowed between the second chamber 72 and the outside world and the second chamber 72 is set to the second pressure P2. Subsequently, as shown in FIG. 15, the sealing layer 90 is formed, which coats the previously exposed part of the portion 126A of the permeable layer 25 upwardly, so as to hermetically close the second chamber 72.

Figure 16:
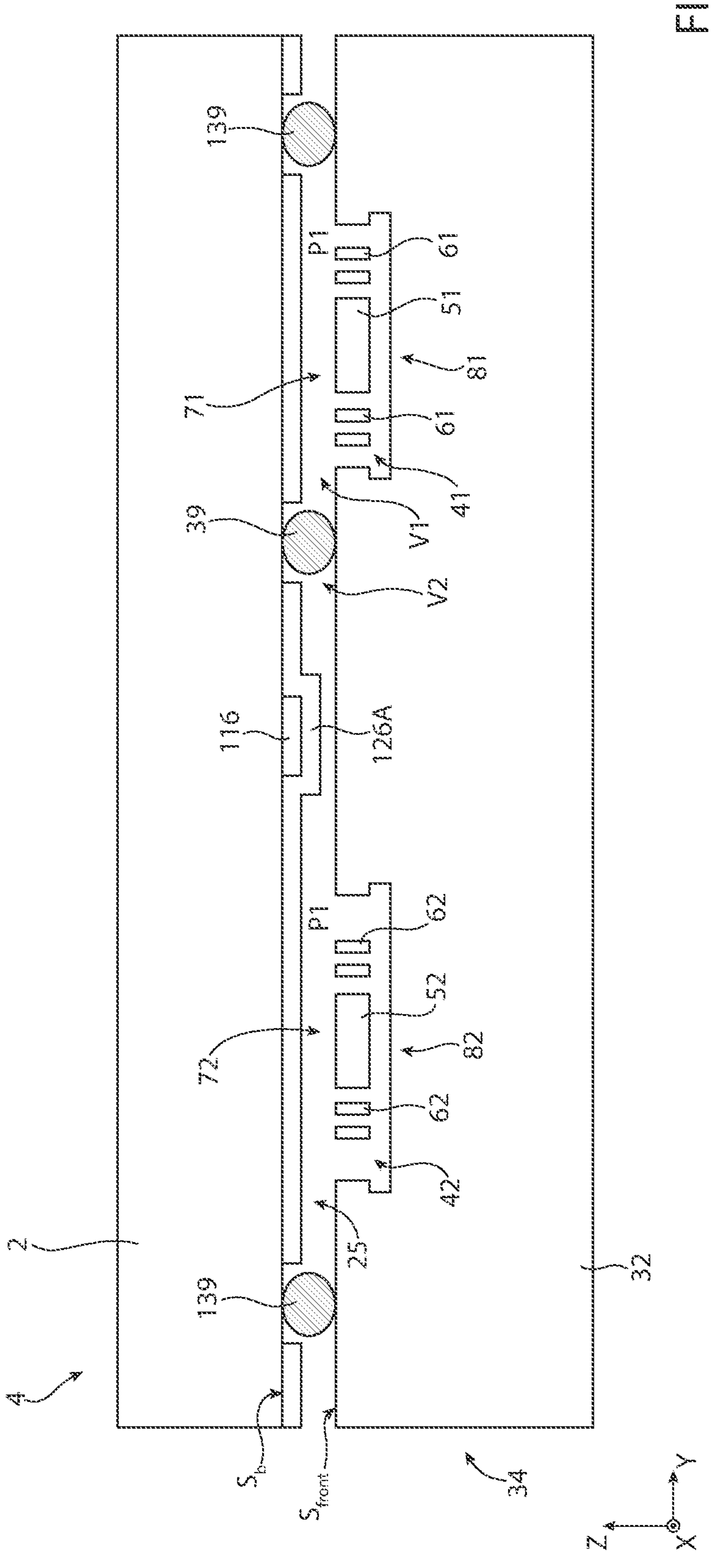
FIG. 16 schematically shows a cross-section of the present MEMS device during a step of a further variant of the manufacturing process.

Embodiments are also possible wherein the first and the second main cap cavities 11, 12 are also absent, as shown for example in FIG. 16, which refers, by way of example, to the same step of the manufacturing process shown in FIG. 7. In this case, the dielectric region 116 coats a portion of the bottom surface Se of the semiconductor substrate 2 of the first wafer 4; the manufacturing process is the same as previously described, therefore it is neither shown nor described again. The first and the second chambers 71, 72 are again delimited upwardly by corresponding portions of the first wafer 4.

Again with reference to the manufacturing process, although it has been described with reference to the manufacturing of a single MEMS device, it may be applied to simultaneously form multiple MEMS devices equal to each other. In this case, the second wafer 34 comprises a plurality of MEMS accelerometers 81 and a plurality of MEMS gyroscopes 82; the first wafer 4 therefore modifies accordingly. Furthermore, the manufacturing process comprises dicing operations of the group formed by the first and the second wafers 4, 34, so as to singulate the MEMS devices.

Furthermore, more than one movable mass may be present in the first and/or in the second chamber 71, 72; one or more getter regions may be formed inside the first and/or the second chamber 71, 72.

Finally, the second pressure P2 may be greater than the first pressure P1, in which case the first movable mass 51 forms a gyroscope, while the second movable mass 52 forms an accelerometer.

A process for manufacturing a MEMS device (100), may be summarized as including: forming a dielectric region (16; 116) which coats part of a semiconductive substrate (2) of a first semiconductive wafer (4); forming a permeable region (26A-26C; 126A), which is permeable to gases and coats the dielectric region (16; 116), so that the dielectric region (16; 116) is interposed between the semiconductive substrate (2) and the permeable region (26A-26C; 126A); and coupling the first semiconductive wafer (4) to a second semiconductive wafer (34), which include a main body (32) wherein a first and a second cavity (41,42) are formed, the second semiconductive wafer (34) further including at least a first and a second movable mass (51,52), which are suspended respectively on the first and the second cavities (41,42), and wherein coupling the first and the second semiconductive wafers (4,34) includes coupling the first and the second semiconductive wafers (4,34) so as to form: a first chamber (71), which is delimited by a corresponding portion of the first semiconductive wafer (4), includes the first cavity (41) and houses the first movable mass (51), the first chamber (71) being also hermetically closed, the pressure within the first chamber (71) being equal to a first value (P1); and a second chamber (72), which is delimited by a corresponding portion of the first semiconductive wafer (4), includes the second cavity (42) and houses the second movable mass (52), the second chamber (72) being also hermetically closed, the pressure within the second chamber (72) being equal to the first value (P1), the permeable region (26A-26C; 126A) facing the second chamber (72), said manufacturing process further including: selectively removing a portion of the semiconductor substrate (2) and an underlying portion of the dielectric region (16; 116), so as to expose a part of the permeable region (26A-26C; 126A), so as to allow gas exchanges through the permeable region (26A-26C; 126A); placing the first and the second semiconductive wafers (4,34) in an environment with a pressure equal to a second value (P2), so that the pressure in the second chamber (72) becomes equal to the second value (P2); and subsequently on the exposed part of the permeable region (26A-26C; 126A), forming a sealing region (90) impermeable to gases, so as to hermetically close the second chamber (72).

The permeable region (26A-26C; 126A) may be formed by permeable polysilicon.

The dielectric region (16; 116) may be formed by oxide.

The sealing region (90) may be formed by amorphous polysilicon.

Coupling the first and the second semiconductive wafers (4,34) may include carrying out a bonding by a glass-frit region (39; 139).

The glass-frit region (39) may laterally delimit the first and the second chambers (71,72).

The manufacturing process may include removing said underlying portion of the dielectric region (16; 116) in said environment with pressure equal to the second value (P2).

The manufacturing process may include forming an accelerometer (81) and a gyroscope (82), which respectively include the first and the second movable masses (51,52).

A MEMS device (100) including a cap (103) may be summarized as including: a semiconductive substrate (2); a dielectric region (16; 116) which coats part of the semiconductive substrate (2); and a permeable region (26A-26C; 126A), which is permeable to gases and coats the dielectric region (16; 116), so that the dielectric region (16; 116) is interposed between the semiconductive substrate (2) and the permeable region (26A-26C; 126A), said MEMS device (100) further including: a main body (32) wherein a first and a second cavity (41,42) are formed; and a first and a second movable mass (51,52), which are suspended respectively on the first and the second cavities (41,42), and wherein the cap (103) is coupled to the main body (32) so as to form: a first chamber (71), which is delimited by a corresponding portion of the cap (103), includes the first cavity (41) and houses the first movable mass (51), the first chamber (71) also being hermetically closed, the pressure within the first chamber (71) being equal to a first value (P1); and a second chamber (72), which is delimited by a corresponding portion of the cap (103), includes the second cavity (42) and houses the second movable mass (52), the second chamber (72) also being hermetically closed, the pressure within the second chamber (72) being equal to a second value (P2), the permeable region (26A-26C; 126A) facing the second chamber (72), said MEMS device (100) further including: an opening (89) which extends through the semiconductive substrate (2) and the dielectric region (16; 116), up to the permeable region (26A-26C; 126A); and a sealing region (90), which is impermeable to gases and extends into the opening (89) up to contacting the permeable region (26A-26C; 126A), so as to hermetically close the second chamber (72).

The permeable region (26A-26C; 126A) may be formed by permeable polysilicon.

The dielectric region (16; 116) may be formed by oxide.

The sealing region (90) may be formed by amorphous polysilicon.

The MEMS device may further include a glass-frit region (39; 139), which is interposed between the semiconductive substrate (2) and the main body (32), wherewith it is in direct contact, and laterally delimits the first and the second chambers (71,72).

The MEMS device may include an accelerometer (81) and a gyroscope (82), which respectively include the first and the second movable masses (51,52).

The various embodiments described above can be combined to provide further embodiments. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method, comprising:

forming a dielectric region coating part of a semiconductive substrate of a first semiconductive wafer;

forming a permeable region, which is permeable to gases, coating the dielectric region interposing the dielectric region between the semiconductive substrate and the permeable region; and coupling the first semiconductive wafer to a second semiconductive wafer, the second semiconductive wafer comprises a main body including a first cavity and a second cavity, the second semiconductive wafer further comprising at least a first movable mass and a second movable mass, the first movable mass is suspended over the first cavity and the second movable mass is suspended over the second cavity, and coupling the first semiconductive wafer to the second semiconductive wafer forming:

a first chamber delimited by a corresponding portion of the first semiconductive wafer, the first chamber includes the first cavity and houses the first movable mass, the first chamber being hermetically closed, a first pressure within the first chamber being equal to a first value; and a second chamber delimited by a corresponding portion of the first semiconductive wafer, the second chamber includes the second cavity and houses the second movable mass, the second chamber being hermetically closed, a second pressure within the second chamber being equal to the first value, the permeable region overlapping the second chamber;

selectively removing a portion of the semiconductive substrate and an underlying portion of the dielectric region exposing a part of the permeable region allowing gas exchanges through the permeable region;

placing the first and the second semiconductive wafers in an environment with a pressure equal to a second value pressurizing the second chamber to be at the second pressure; and after exposing the part of the permeable region, forming a sealing region impermeable to gases on the part of the permeable region hermetically closing the second chamber.

2. The method according to claim 1, wherein the permeable region is formed by permeable polysilicon.

3. The method according to claim 1, wherein the dielectric region is formed by oxide.

4. The method according to claim 1, wherein the sealing region is formed by amorphous polysilicon.

5. The method according to claim 1, wherein coupling the first and the second semiconductive wafers comprises carrying out a bonding by a glass-frit region.

6. The method according to claim 5, wherein the glass-frit region laterally delimits the first and the second chambers.

7. The method according to claim 1, comprising removing the underlying portion of the dielectric region in the environment with pressure equal to the second value.

8. The method according to claim 1, comprising forming an accelerometer and a gyroscope, which respectively include the first and the second movable masses.

9. A device, comprising:

a cap including:

a semiconductive substrate;

a dielectric region that coats part of the semiconductive substrate; and a permeable region, which is permeable to gases, that coats the dielectric region, and the dielectric region is interposed between the semiconductive substrate and the permeable region;

a main body coupled to the cap, the main body including a first cavity, a second cavity, a first movable mass, and a second movable mass, the first movable mass is suspended over the first cavity and the second movable mass is suspended over the second cavity;

a first chamber is delimited by a corresponding portion of the cap, the first chamber includes the first cavity and houses the first movable mass, the first chamber being hermetically closed, a first pressure within the first chamber being equal to a first value; and a second chamber is delimited by a corresponding portion of the cap, the second chamber includes the second cavity and houses the second movable mass, the second chamber being hermetically closed, a second pressure within the second chamber being equal to a second value, the permeable region overlaps the second chamber;

an opening that extends through the semiconductive substrate and the dielectric region to the permeable region; and a sealing region, which is impermeable to gases, that extends into the opening to the permeable region and hermetically closes the second chamber.

10. The device according to claim 9, wherein the permeable region is formed by permeable polysilicon.

11. The device according to claim 9, wherein the dielectric region is formed by an oxide.

12. The device according to claim 9, wherein the sealing region is formed by an amorphous polysilicon.

13. The device according to claim 9, further comprising a glass-frit region interposed between the semiconductive substrate and the main body, and the glass-frit region is in direct contact and laterally delimits the first and the second chambers.

14. The device according to claim 9, further comprising:

an accelerometer that includes the first moveable mass; and a gyroscope that includes the second movable mass.

15. A device, comprising:

a main body including:

a first side and a second side opposite to the first side;

a first cavity and a second cavity at the first side, the first cavity is spaced apart from the second cavity; and a first movable mass suspended over the first cavity and a second movable mass suspended over the second cavity;

a cap coupled to the first side of the main body overlapping the first cavity, the second cavity, the first movable mass, and the second movable mass, the cap including:

a third side and a fourth side opposite to the third side, the third side is coupled to the first side of the main body;

a substrate including a first cap cavity overlapping the first cavity and the first movable mass, a second cap cavity overlapping the second cavity and the second movable mass, and a third cap cavity between the first cap cavity and the second cap cavity;

a dielectric layer is within the third cap cavity and lines the third cap cavity; and a permeable layer is within the third cap cavity and is on the dielectric layer, the permeable layer is spaced apart from the substrate by the dielectric layer;

a sealing layer extends into the fourth side of the cap, wherein the sealing layer extends through the substrate and extends through the dielectric layer to the permeable layer within the third cap cavity;

a glass-frit region couples the third side of the cap to the first side of the main body, the glass-frit region defines:

a first chamber housing the first movable mass, the first chamber includes the first cavity and the first cap cavity, the first chamber is hermetically closed; and a second chamber housing the second movable mass, the second chamber includes the second cavity, the second cap cavity, and the third cap cavity, the second chamber is hermetically closed.

16. The device of claim 15, wherein the first chamber is hermetically closed between the glass-frit region, the cap, and the main body.

17. The device of claim 16, wherein the second chamber is hermetically closed between the glass-frit region, the sealing layer, the cap, and the main body.

18. The device of claim 15, wherein the second chamber is hermetically closed between the glass-frit region, the sealing layer, the cap, and the main body.

19. The device of claim 15, wherein the glass-frit region extends continuously around the first chamber and the second chamber and between the first chamber and the second chamber.

20. The device of claim 15, wherein the glass-frit region separates the first chamber from the second chamber.

* * * * *